(12) United States Patent
Kim et al.

(10) Patent No.: US 10,103,210 B2
(45) Date of Patent: Oct. 16, 2018

(54) ORGANIC LIGHT EMITTING DISPLAY DEVICE

(71) Applicant: LG Display Co., Ltd., Seoul (KR)

(72) Inventors: Eunah Kim, Asan-si (KR); SeYeoul Kwon, Goyang-si (KR); MiReum Lee, Gimhae-si (KR); Chanil Park, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 3 days.

(21) Appl. No.: 15/254,122

(22) Filed: Sep. 1, 2016

(65) Prior Publication Data

US 2017/0125492 A1    May 4, 2017

(30) Foreign Application Priority Data

Oct. 30, 2015 (KR) .......... 10-2015-0152619

(51) Int. Cl.
| | |
|---|---|
| *H01L 51/00* | (2006.01) |
| *H01L 27/32* | (2006.01) |
| *H01L 29/45* | (2006.01) |
| *H01L 29/49* | (2006.01) |
| *H01L 27/12* | (2006.01) |

(Continued)

(52) U.S. Cl.
CPC ........ *H01L 27/3244* (2013.01); *H01L 27/124* (2013.01); *H01L 27/1218* (2013.01); *H01L 29/42384* (2013.01); *H01L 29/43* (2013.01); *H01L 29/458* (2013.01); *H01L 29/4908* (2013.01); *H01L 29/78603* (2013.01); *H01L 51/055* (2013.01); *H01L 51/102* (2013.01); *H01L 51/5271* (2013.01); *H01L 51/5284* (2013.01); *H01L 51/56* (2013.01);
(Continued)

(58) Field of Classification Search
CPC ............. H01L 27/3244; H01L 51/5271; H01L 51/5284; H01L 51/56; H01L 51/5218; H01L 51/5234; H01L 51/055; H01L 29/4908; H01L 29/43; H01L 29/42384; H01L 29/78603; H01L 27/1218; H01L 27/162; H01L 2924/13069
See application file for complete search history.

(56) References Cited

U.S. PATENT DOCUMENTS

| | | | |
|---|---|---|---|
| 7,612,850 B2* | 11/2009 | Inoue ................. | G02F 1/133555 349/114 |
| 7,872,288 B2* | 1/2011 | Yang ................... | H01L 27/3269 257/292 |

(Continued)

*Primary Examiner* — Sophia Nguyen
(74) *Attorney, Agent, or Firm* — Birch, Stewart, Kolasch & Birch, LLP

(57) ABSTRACT

An organic light emitting display device is discussed. The organic light emitting display device according to an embodiment includes a base substrate, a buffer layer disposed on the base substrate, and a thin film transistor disposed on the buffer layer. The organic light emitting display device further includes an organic light emitting diode connected to the thin film transistor and disposed on the thin film transistor. The thin film transistor includes a gate electrode, a source electrode, and a drain electrode. At least one of the gate, source, and drain electrodes of the thin film transistor includes a semi-transmissive metal layer, a transparent metal layer, and a reflective metal layer to improve outdoor visibility of a display panel by reducing reflectance of the electrodes even though a polarizer is removed.

18 Claims, 6 Drawing Sheets

(51) Int. Cl.
  *H01L 29/423* (2006.01)
  *H01L 29/43* (2006.01)
  *H01L 29/786* (2006.01)
  *H01L 51/05* (2006.01)
  *H01L 51/56* (2006.01)
  *H01L 51/10* (2006.01)
  *H01L 51/52* (2006.01)

(52) U.S. Cl.
  CPC ...... *H01L 51/5218* (2013.01); *H01L 51/5234* (2013.01); *H01L 2924/13069* (2013.01)

(56) References Cited

U.S. PATENT DOCUMENTS

| | | | | |
|---|---|---|---|---|
| 8,022,622 | B2* | 9/2011 | Choi | H01L 27/3269 313/506 |
| 8,227,808 | B2* | 7/2012 | Wan | G09G 3/3225 257/350 |
| 8,415,873 | B2* | 4/2013 | Kang | H01L 27/3232 313/504 |
| 8,907,324 | B2* | 12/2014 | Park | H01G 9/2031 257/40 |
| 9,012,915 | B2* | 4/2015 | Oh | H01L 51/5265 257/59 |
| 9,013,461 | B2* | 4/2015 | Hwang | H01L 27/3279 315/167 |
| 9,082,997 | B2* | 7/2015 | Baek | H01L 51/5203 |
| 9,144,119 | B2* | 9/2015 | Kim | H01L 51/525 |
| 9,202,855 | B1* | 12/2015 | Jo | H01L 27/3211 |
| 9,356,239 | B2* | 5/2016 | Hsu | H01L 51/002 |
| 9,496,321 | B2* | 11/2016 | Yang | H01L 27/1214 |
| 9,543,367 | B2* | 1/2017 | Park | H01L 27/3265 |
| 9,627,653 | B2* | 4/2017 | Uezawa | G02B 5/021 |
| 9,634,077 | B2* | 4/2017 | Park | H01L 27/3265 |
| 9,680,114 | B2* | 6/2017 | Yao | H01L 51/0097 |
| 9,686,837 | B1* | 6/2017 | Yang | G06F 1/1652 |
| 9,728,122 | B2* | 8/2017 | Jin | G09G 3/3225 |
| 2008/0149930 | A1* | 6/2008 | Lee | H01L 29/458 257/59 |
| 2009/0297870 | A1* | 12/2009 | Takeyama | C08F 232/08 428/523 |
| 2011/0278615 | A1* | 11/2011 | No | H01L 27/3248 257/98 |
| 2011/0291552 | A1* | 12/2011 | Kwon | C09K 9/02 313/504 |
| 2011/0297944 | A1 | 12/2011 | Choi et al. | |
| 2011/0309339 | A1* | 12/2011 | You | H01L 27/3248 257/40 |
| 2012/0104396 | A1 | 5/2012 | Pyo | |
| 2012/0104430 | A1* | 5/2012 | Kim | H01L 51/5268 257/91 |
| 2012/0126227 | A1* | 5/2012 | Maeda | H01L 27/1225 257/43 |
| 2012/0146031 | A1* | 6/2012 | Lee | H01L 27/3265 257/59 |
| 2012/0168755 | A1 | 7/2012 | Choi | |
| 2012/0319115 | A1 | 12/2012 | Lee et al. | |
| 2013/0001578 | A1* | 1/2013 | Song | H01L 51/5275 257/71 |
| 2013/0207110 | A1* | 8/2013 | Seo | H01L 29/786 257/57 |
| 2014/0091306 | A1* | 4/2014 | Miki | H01L 29/458 257/59 |
| 2014/0131683 | A1* | 5/2014 | Kim | H01L 51/5253 257/40 |
| 2014/0167009 | A1* | 6/2014 | Lee | H01L 27/3272 257/40 |
| 2014/0217397 | A1* | 8/2014 | Kwak | H01L 27/1218 257/43 |
| 2014/0293182 | A1* | 10/2014 | Kim | G02F 1/136209 349/43 |
| 2014/0306941 | A1* | 10/2014 | Kim | H04M 1/0268 345/204 |
| 2014/0368228 | A1* | 12/2014 | Kim | G02F 1/1309 324/750.3 |
| 2015/0048398 | A1* | 2/2015 | Ichikawa | H01L 33/504 257/98 |
| 2015/0069359 | A1* | 3/2015 | Yoon | H01L 51/5253 257/40 |
| 2015/0084008 | A1* | 3/2015 | Park | H01L 27/3265 257/40 |
| 2015/0138480 | A1* | 5/2015 | Yi | G02F 1/13439 349/44 |
| 2015/0140321 | A1* | 5/2015 | Gennett | C23C 28/04 428/332 |
| 2015/0160767 | A1* | 6/2015 | Song | G06F 3/0412 345/174 |
| 2015/0228705 | A1* | 8/2015 | Kim | H01L 27/3248 257/40 |
| 2015/0279917 | A1* | 10/2015 | Yang | H01L 27/124 257/40 |
| 2016/0005803 | A1* | 1/2016 | Ryu | H01L 27/3248 257/40 |
| 2016/0049426 | A1* | 2/2016 | Lim | H01L 27/124 257/72 |
| 2016/0049443 | A1* | 2/2016 | Kim | H01L 51/0023 257/91 |
| 2016/0079315 | A1* | 3/2016 | Oh | H01L 51/5271 257/40 |
| 2016/0118629 | A1* | 4/2016 | Hsieh | H01L 51/5281 257/40 |
| 2016/0155788 | A1* | 6/2016 | Kwon | H01L 27/3276 257/40 |
| 2016/0323993 | A1* | 11/2016 | Kwon | G02F 1/133305 |
| 2016/0323994 | A1* | 11/2016 | Kwon | G02F 1/133305 |
| 2017/0125492 | A1* | 5/2017 | Kim | H01L 27/3244 |
| 2017/0125733 | A1* | 5/2017 | Kwon | H01L 51/5253 |
| 2017/0170243 | A1* | 6/2017 | An | G02F 1/163 |
| 2017/0194411 | A1* | 7/2017 | Park | H01L 51/5253 |
| 2017/0194415 | A1* | 7/2017 | Choi | H01L 51/0096 |
| 2018/0069065 | A1* | 3/2018 | Chen | H01L 27/3258 |
| 2018/0190822 | A1* | 7/2018 | Park | H01L 29/7869 |

* cited by examiner

ORGANIC LIGHT EMITTING DISPLAY DEVICE

CROSS REFERENCE TO RELATED APPLICATIONS

This application claims priority from and the benefit under 35 U.S.C. § 119(a) of the Korean Patent Application No. 10-2015-0152619 filed on Oct. 30, 2015, which is hereby incorporated by reference for all purposes as if fully set forth herein.

BACKGROUND OF THE INVENTION

Field of the Invention

The present invention relates to an organic light emitting display device, and more particularly, to an organic light emitting display device that may improve outdoor visibility of a display panel.

Discussion of the Related Art

Recently, with the advancement of the information age, importance of a flat panel display (FPD) device having excellent characteristics such as a thin profile, light weight and low power consumption has been increased. Examples of the flat panel display device include a liquid crystal display (LCD) device, a plasma display panel (PDP) device, and an organic light emitting display (OLED) device. Recently, an electrophoretic display device (EPD) has been widely used as the flat panel display device.

Among the devices, the liquid crystal display device and the organic light emitting display device, each of which includes a thin film transistor, have been commercially used as display devices of television, notebook computer, tablet computer, or desk top computer owing to their excellent properties in resolution, color display and picture quality. Particularly, the organic light emitting display device is a self light emitting display device, and has received attention as a next generation flat panel display device owning to low power consumption, a fast response speed, high light emission efficiency, high luminance and a broad viewing angle.

The organic light emitting display (OLED) device may be categorized into a top emission type and a bottom emission type depending on a direction to which light emitted through an organic light emitting diode is transmitted.

The bottom emission type organic light emitting display device of the related art includes a base substrate, a thin film transistor (TFT), an organic light emitting diode (OLED), and an encapsulation layer. The gate and data lines are provided on the base substrate so as to cross each other to define a pixel, and the thin film transistor is provided in each pixel. The thin film transistor includes an active layer, a gate insulating film, a gate electrode, an interlayer dielectric, a source electrode and a drain electrode, which are sequentially deposited. The organic light emitting diode (OLED) is provided on the thin film transistor, and is electrically connected to the drain electrode of the thin film transistor. The organic light emitting diode includes an anode electrode, an organic light emitting layer, and a cathode electrode. The encapsulation layer protects the thin film transistor and the organic light emitting diode from external impact.

In the aforementioned bottom emission type organic light emitting display device of the related art, external light entering a display panel is reflected toward the outside of the display panel by electrodes provided inside the display panel. For this reason, outdoor visibility of the display panel may be deteriorated. To improve outdoor visibility, in the bottom emission structure, a polarizer should be arranged on a lower surface of the base substrate, to which light is emitted. However, there is a problem that the luminance of the display panel decreases due to the polarizer.

SUMMARY OF THE INVENTION

Accordingly, the present invention is directed to an organic light emitting display device that substantially obviates one or more problems due to limitations and disadvantages of the related art.

An advantage of the present invention is to provide an organic light emitting display device that may improve outdoor visibility of a display panel by reducing reflectance of the electrodes provided inside the display panel even though a polarizer is removed.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic light emitting display device comprises a base substrate; a buffer layer arranged on the base substrate; a thin film transistor arranged on the buffer layer, the thin film transistor including a gate electrode, a source electrode, and a drain electrode; and an organic light emitting diode connected to the thin film transistor and arranged on the thin film transistor, wherein at least one of the gate electrode, the source electrode and the drain electrode includes a semi-transmissive metal layer, a transparent metal layer, and a reflective metal layer.

According to another embodiment, the organic light emitting display device includes a base substrate, a buffer layer disposed on the base substrate, and a thin film transistor disposed on the buffer layer. The organic light emitting display device further includes an organic light emitting diode connected to the thin film transistor and disposed on the thin film transistor, and a lower film provided below the base substrate. The thin film transistor includes a gate electrode, a source electrode, and a drain electrode. At least one of the gate, source, and drain electrodes of the thin film transistor includes a semi-transmissive metal layer, a transparent metal layer, and a reflective metal layer to improve outdoor visibility of a display panel by reducing reflectance of the electrodes even though a polarizer is removed.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE EMBODIMENTS

Meaning of the terms described in this specification are to be understood as follows.

The term of a singular expression should be understood to include a multiple expression as well as the singular expression if there is no specific definition in the context. The terms such as "the first" and "the second" are used only to differentiate one element from other elements. Thus, a scope of claims is not limited by these terms. Also, it should be understood that the term such as "include" or "have" does not preclude existence or possibility of one or more features, numbers, steps, operations, elements, parts or their combinations. It should be understood that the term "at least one" includes all combinations related with any one item. For example, "at least one among a first element, a second element and a third element" may include all combinations of two or more elements selected from the first, second and third elements as well as each element of the first, second and third elements. Also, if it is mentioned that a first element is positioned "on or above" a second element, it should be understood that the first and second elements may be brought into contact with each other, or a third element may be interposed between the first and second elements.

Hereinafter, the preferred embodiments of an organic light emitting display device according to the present invention will be described with reference to the accompanying drawings. Wherever possible, the same reference numbers will be used throughout the drawings to refer to the same or like parts. Also, in the following description of the present invention, if detailed description of elements or functions known in respect of the present invention is determined to make the subject matter of the present invention unnecessarily obscure, the detailed description will be omitted.

Figure 1:
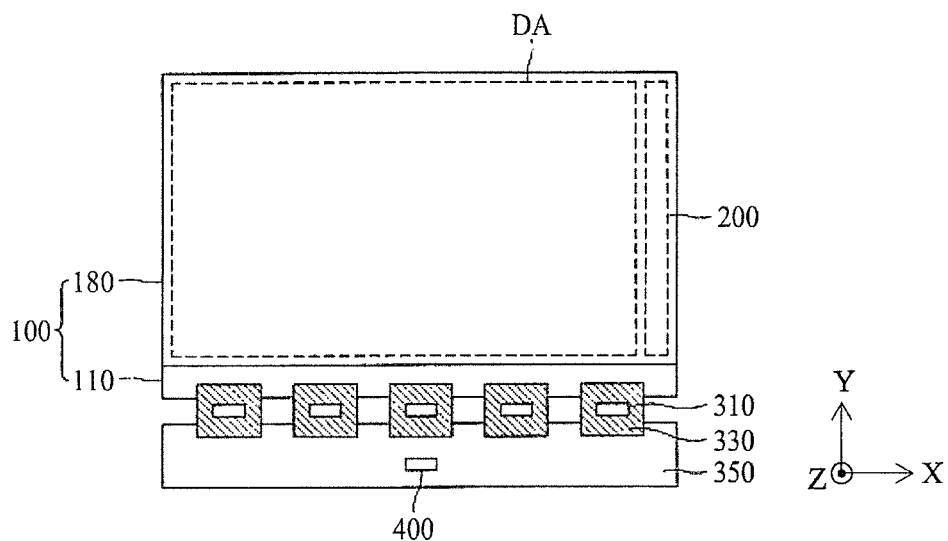
FIG. 1 is a plan view illustrating an organic light emitting display panel, a gate driver, a source drive IC, a flexible film, a circuit board and a timing controller of an organic light emitting display device according to an embodiment of the present invention.

FIG. 1 is a plan view illustrating an organic light emitting display panel 100, a gate driver 200, a source drive IC 310, a flexible film 330, a circuit board 350 and a timing controller 400 of an organic light emitting display device according to the embodiment of the present invention.

In FIG. 1, the X axis represents a direction parallel with a gate line, the Y axis represents a direction parallel with a data line, and the Z axis represents a height direction of the organic light emitting display device.

Referring to FIG. 1, the organic light emitting display device according to the embodiment of the present invention includes an organic light emitting display panel 100, a gate driver 200, a source drive integrated circuit (hereinafter, referred to as "IC") 310, a flexible film 330, a circuit board 350, and a timing controller 400.

The organic light emitting display panel 100 includes a base substrate 110 and an encapsulation layer 180. Gate lines and data lines may be formed in a display area DA of the base substrate 110, and light emitting portions may be formed in crossing areas where the gate lines cross the data lines. The light emitting portions of the display area DA may display images. The encapsulation layer 180 is provided above the base substrate 110. The encapsulation layer 180 serves to protect elements provided on the base substrate 110 and prevent water from being permeated into the organic light emitting display panel 100. The encapsulation layer 180 is formed to be smaller than the base substrate 110, whereby the base substrate 110 may partially be exposed without being covered by the encapsulation layer 180.

The organic light emitting display panel 100 according to the embodiment of the present invention will be described in detail with reference to FIGS. 2 to 9.

The gate driver 200 supplies gate signals to the gate lines in accordance with a gate control signal input from the timing controller 400. In the embodiment of the present invention, the gate driver 200 is formed, but not limited to, outside one side of the display area DA of the organic light emitting display panel 100 in a gate driver in panel (GIP) mode. That is, the gate driver 200 may be formed outside both sides of the display area DA of the organic light emitting display panel 100 in a GIP mode, or may be fabricated as a driving chip, packaged in a flexible film and attached to the organic light emitting display panel 100 in a tape automated bonding (TAB) mode.

The source drive IC 310 receives digital video data and a source control signal from the timing controller 400. The source drive IC 310 converts the digital video data to analog data voltages in accordance with the source control signal and supplies the analog data voltages to the data lines. If the source drive IC 310 is fabricated as a driving chip, the source drive IC may be packaged in the flexible film 330 in a chip on film (COF) or chip on plastic (COP) mode.

Part of the base substrate 110 may be exposed without being covered by the encapsulation layer 180. Pads, such as the data pads are provided in the base substrate 110 which is exposed without being covered by the encapsulation layer 180. Lines which connect the pads with the source drive IC 310 and lines which connect the pads with lines of the circuit board 350 may be formed in the flexible film 330. The flexible film 330 is attached onto the pads using an anisotropic conducting film, whereby the pads may be connected to the lines of the flexible film 330.

The circuit board 350 may be attached to the flexible films 330. A plurality of circuits comprised of driving chips may be packaged in the circuit board 350. For example, the timing controller 400 may be packaged in the circuit board 350. The circuit board 350 may be a printed circuit board or a flexible printed circuit board.

The timing controller 400 receives digital video data and a timing signal from an external system board. The timing controller 400 generates a gate control signal for controlling an operation timing of the gate driver 200 and a source control signal for controlling the source drive ICs 330 on the basis of the timing signal. The timing controller 400 supplies the gate control signal to the gate driver 200, and supplies the source control signal to the source drive ICs 330.

Figure 2:
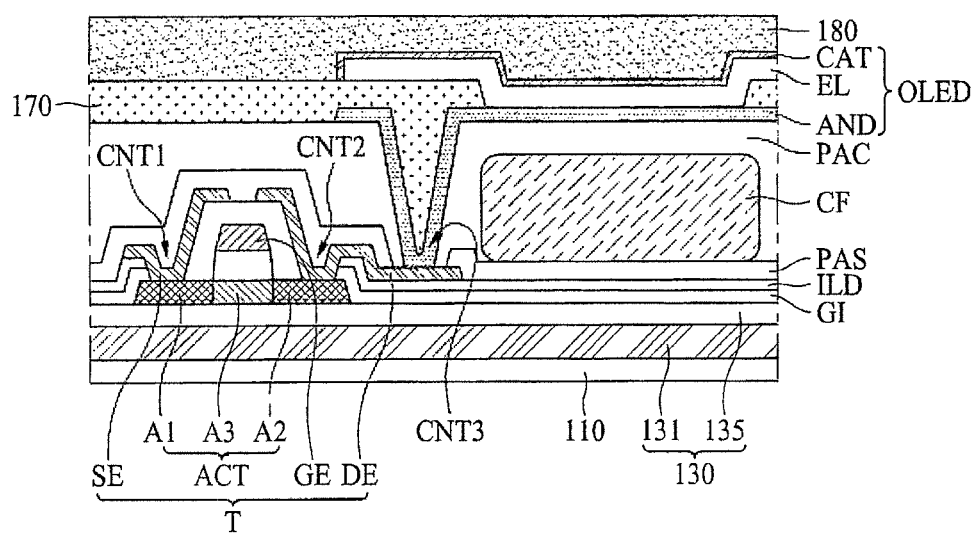
FIG. 2 is a cross-sectional view illustrating an organic light emitting display panel according to the embodiment of the present invention.

FIG. 2 is a cross-sectional view illustrating an organic light emitting display panel according to the embodiment of the present invention.

Referring to FIG. 2, the organic light emitting display panel 100 according to the embodiment of the present invention includes a base substrate 110, a buffer layer 130, a thin film transistor T, a passivation layer PAS, a color filter CF, a planarization layer PAC, an organic light emitting diode OLED, a bank 170, and an encapsulation layer 180.

The base substrate 110 may be a flexible plastic film. For example, the base substrate 110 may be a transparent polyimide (PI) film having a low coefficient of thermal expansion (CTE) of 10 ppm/° C. or less. In this case, the coefficient of thermal expansion (CTE) is defined by a dimension variation of a polyimide film, which is based on a variation of a unit temperature. The base substrate 110 may be provided through process steps of forming a polyimide film by coating a polyimide (PI) in a liquid state on an auxiliary substrate and drying the polyimide, and detaching the polyimide film from the auxiliary substrate by using a laser release process. In this case, an organic substrate may be used as the auxiliary substrate. In the embodiment of the present invention, since the polyimide film having a coefficient of thermal expansion (CTE) of 10 ppm/° C. or less is used as the base substrate 110, the polyimide film may prevent deformation of the base substrate 110, which is caused during the laser release process, from occurring, as compared with the related art to which a base substrate having a coefficient of thermal expansion (CTE) of 30 ppm/° C. is applied. In this case, deformation may mean that the base substrate 110 is twisted or rolled up in an unwanted direction.

The buffer layer 130 is provided on the base substrate 110. The buffer layer 130 includes a first buffer layer 131 and a second buffer layer 135.

The first buffer layer 131 is provided on the base substrate 110. The first buffer layer 131 serves to prevent water from being permeated from the base substrate 110, which is vulnerable to moisture permeability, into the organic light emitting display panel 100. Also, the first buffer layer 131 serves to lower reflectance of external light reflected by electrodes provided inside the organic light emitting display panel 100 and emitted to the outside. To this end, the first buffer layer 131 may be a multi-layer that includes a silicon dioxide ($SiO_2$) film and a silicon nitride (SiNx) film. In this case, a thickness of the silicon dioxide film may be any one of values in the range of 1500 Å to 2000 Å. This first buffer layer 131 will be described later in detail with reference to FIGS. 7 to 9.

The second buffer layer 135 is provided on the first buffer layer 131. The second buffer layer 135 serves to prevent impurities such as metal ions diffused from the base substrate 110 from being permeated into an active layer ACT of the thin film transistor T. Also, the second buffer layer 135 serves to prevent water from being permeated into the organic light emitting display panel 100 so as not to deteriorate properties of the thin film transistor T. For example, the second buffer layer 135 may be, but is not limited to, a silicon dioxide film, a silicon nitride film, or their multilayer.

Since the second buffer layer 135 according to the embodiment of the present invention is directly in contact with the thin film transistor T, it is preferable that an inorganic film, which may minimize occurrence of hydrogen, is used as the second buffer layer 135. Therefore, the silicon dioxide film of which hydrogen content is relatively lower than that of the silicon nitride film may be used as the second buffer layer 135. In this case, the hydrogen content of the silicon nitride film is 15% to 20%, and the hydrogen content of the silicon dioxide film is 3% or less.

The thin film transistor T is provided on the buffer layer 130. The thin film transistor T includes an active layer ACT, a gate insulating GI film, a gate electrode GE, an interlayer dielectric ILD, a source electrode SE, and a drain electrode DE.

The active layer ACT is provided on the second buffer layer 135. The active layer ACT is overlapped with the gate electrode GE. The active layer ACT may be comprised of one end area A1 disposed at the source electrode SE, the other end area A2 disposed at the drain electrode DE, and a center area A3 disposed between the one end area A1 and the other end area A2. The center area A3 may be made of a semiconductor material which is not doped with a dopant, and each of the one end area A1 and the other end area A2 may be made of a semiconductor material which is doped with a dopant.

The gate insulating GI film is provided on the active layer ACT. The gate insulating GI film serves to insulate the active layer ACT from the gate electrode GE. The gate insulating GI film covers the active layer ACT. For example, the gate insulating GI film may be, but is not limited to, a silicon dioxide film, a silicon nitride film, or their multi-layer.

The gate electrode GE is provided on the gate insulating GI film. The gate electrode GE is overlapped with the center area A3 of the active layer ACT by interposing the gate insulating GI film therebetween. The gate electrode GE according to the embodiment of the present invention includes a semi-transmissive metal layer, a transparent metal layer, and a reflective metal layer, which are sequentially deposited on the base substrate 110. Among the metal layers, the semi-transmissive metal layer may be the thinnest, and the reflective metal layer may be the thickest.

According to the embodiment of the present invention, destructive interference occurs between reflective light at the semi-transmissive metal layer and reflective light at the reflective metal layer in accordance with the thickness of the transparent metal layer provided between the semi-transmissive metal layer and the reflective metal layer, whereby reflectance of the gate electrode GE may be reduced. Since reflectance of the gate electrode GE is reduced, reflective light emitted to the outside of the display panel is reduced, whereby outdoor visibility of the display panel may be improved. In this case, the thickness of the transparent metal layer may be any one of values in the range of 350 Å to 450 Å. The gate electrode GE will be described later with reference to FIGS. 3 to 6.

The interlayer dielectric ILD is provided on the gate electrode GE. The interlayer dielectric ILD serves to insulate the gate electrode GE from the source electrode SE and the drain electrode DE. The interlayer dielectric ILD may be, but is not limited to, the same inorganic film as that of the gate insulating GI film, for example, a silicon dioxide film, a silicon nitride film, or their multi-layer.

The source electrode SE and the drain electrode DE are spaced apart from each other on the interlayer dielectric ILD. A first contact hole CNT1, which partially exposes the one end area A1 of the active layer ACT, and a second contact hole CNT2, which partially exposes the other end area A2 of the active layer ACT, are provided in the gate insulating GI film and the interlayer dielectric ILD. The source electrode SE is connected with the one end area A1 of the active layer ACT through the first contact hole CNT1, and the drain electrode DE is connected to the other end area A2 of the active layer ACT through the second contact hole CNT2.

Each of the source electrode SE and the drain electrode DE according to the embodiment of the present invention may have the same structure as that of the gate electrode GE. That is, each of the source electrode SE and the drain electrode DE may include a semi-transmissive metal layer, a transparent metal layer, and a reflective metal layer, which are sequentially deposited. Among the metal layers, the semi-transmissive metal layer may be the thinnest, and the reflective metal layer may be the thickest. In this case, destructive interference may occur between reflective light at the semi-transmissive metal layer and reflective light at the reflective metal layer in accordance with the thickness of the transparent metal layer provided between the semi-transmissive metal layer and the reflective metal layer. As a result, since reflectance of each of the source electrode SE and the drain electrode DE may be reduced, reflective light emitted to the outside of the display panel may be reduced, whereby outdoor visibility of the display panel may be improved.

The structure of the thin film transistor T is not limited to the aforementioned example, and various modifications may be made in the thin film transistor T by the known structure that may be carried out easily by the person skilled in the art.

The passivation layer PAS is provided on the thin film transistors T. The passivation layer PAS serves to protect the thin film transistor T. The passivation layer PAS may be, but is not limited to, an inorganic film, for example, a silicon dioxide film, a silicon nitride film, or their multi-layer.

The color filter CF is provided on the passivation layer PAS. The color filter CF is provided at a pixel area on the base substrate 110 so as not to overlap the thin film transistor T. The color filter CF is used to realize a color on the organic light emitting display panel 100. The light emitted from the organic light emitting diode OLED is emitted downwardly by passing through the color filter CF.

The planarization layer PAC is provided on the passivation layer PAS. The planarization layer PAC covers the thin film transistor T and the color filter CF. The planarization layer PAC serves to planarize an upper portion of the base substrate 110 provided with the thin film transistor T and the color filter CF. The planarization layer PAC may be made of, but is not limited to, an organic film, for example, acryl resin, epoxy resin, phenolic resin, polyamides resin, or polyimides resin. A third contact hole CNT3, which exposes the drain electrode DE of the thin film transistor T, is provided in the planarization layer PAC and the passivation layer PAS. The drain electrode DE is connected to an anode electrode AND through the third contact hole CNT3.

The organic light emitting diode OLED is connected to the thin film transistor T. The organic light emitting diode OLED is provided on the thin film transistor T and the color filter CF. The organic light emitting diode OLED includes an anode electrode AND, an organic light emitting layer EL, and a cathode electrode CAT.

The anode electrode AND is connected to the drain electrode DE of the thin film transistor T through the third contact hole CNT3 provided in the passivation layer PAS and the planarization layer PAC. The anode electrode AND may be a transparent conductive material of which work function value is relatively large, for example, indium-tin-oxide (ITO) or indium-zinc-oxide (IZO). Also, the anode electrode AND may be comprised of at least two or more layers that include metal materials having excellent reflective efficiency, for example, Al, Ag, APC (Ag;Pb;Cu), etc.

The bank 170 is provided between the anode electrodes AND which are adjacent to each other. The bank 170 electrically insulates the anode electrodes AND which are adjacent to each other. The bank 170 covers one side of the anode electrode AND. The bank 170 according to the embodiment of the present invention may be a black bank that includes a light absorption material. For example, the bank 170 may be made of, but is not limited to, an organic film, which includes a black pigment such as carbon black, for example, an organic film such as polyimides resin, acryl resin, and benzocyclobutene (BCB).

If the related art bank which does not include a light absorption material is used, external light entering the display panel is reflected by the cathode electrode CAT and emitted to the outside of the display panel, whereby a problem may occur in that outdoor visibility of the display panel is deteriorated. However, if the bank 170 according to the present invention, which includes a light absorption material, is used, the bank 170 absorbs both the external light and the reflective light reflected by the cathode electrode CAT, whereby outdoor visibility of the display panel may be improved.

The organic light emitting layer EL is provided on the anode electrode AND. The organic light emitting layer EL may include a hole transporting layer, an organic light emitting layer, and an electron transporting layer. Moreover, the organic light emitting layer EL may further include at least one functional layer for improving emission efficiency and/or lifespan.

The cathode electrode CAT is provided on the organic light emitting layer EL and the bank 170. If a voltage is applied to the anode electrode AND and the cathode electrode CAT, holes and electrons move to the organic light emitting layer EL through the hole transporting layer and the electron transporting layer, respectively, and are combined with each other in the organic light emitting layer EL to emit light.

The encapsulation layer 180 is provided on the thin film transistor T and the organic light emitting diode OLED. The encapsulation layer 180 covers the thin film transistor T and the organic light emitting diode OLED. The encapsulation layer 180 serves to protect the thin film transistor T and an element such as the organic light emitting diode OLED from external impact and prevent water from being permeated into the organic light emitting display panel 100.

The encapsulation layer 180 may include a plurality of inorganic films and a plurality of organic films, which are laminated alternately. The plurality of organic films may be arranged between the respective inorganic films. The encapsulation layer 180 may be comprised of, but is not limited to, the inorganic films. That is, the encapsulation layer 180 may be comprised of the organic films. If the encapsulation layer 180 is comprised of the organic films, a front adhesive layer may additionally be provided on the encapsulation layer 180. In this case, the front adhesive layer may be, but is not limited to, a metal layer or barrier film layer.

Figure 3:
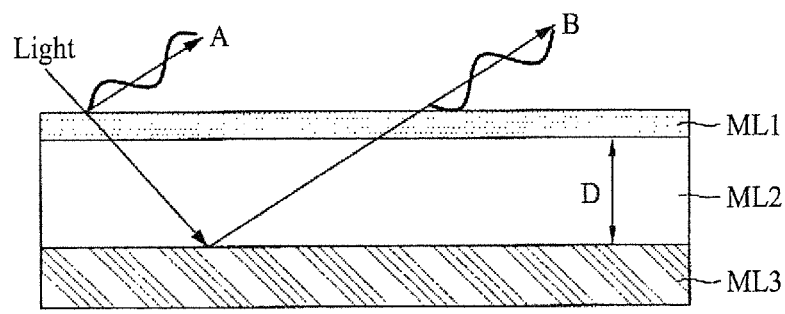
FIG. 3 is a cross-sectional view illustrating a structure of a gate electrode according to the embodiment of the present invention.
Figure 4:
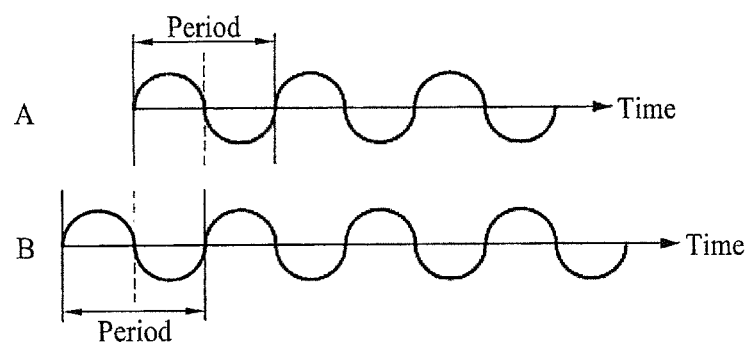
FIGS. 4 and 5 are exemplary views illustrating destructive interference between first reflective light and second reflective light, which are shown in FIG. 3.
Figure 5:
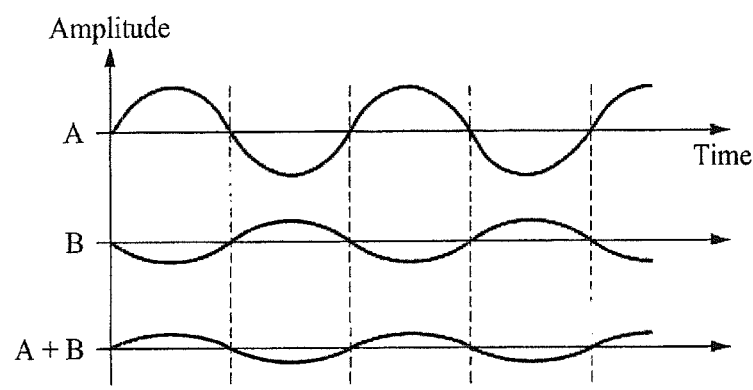
Figure 6:
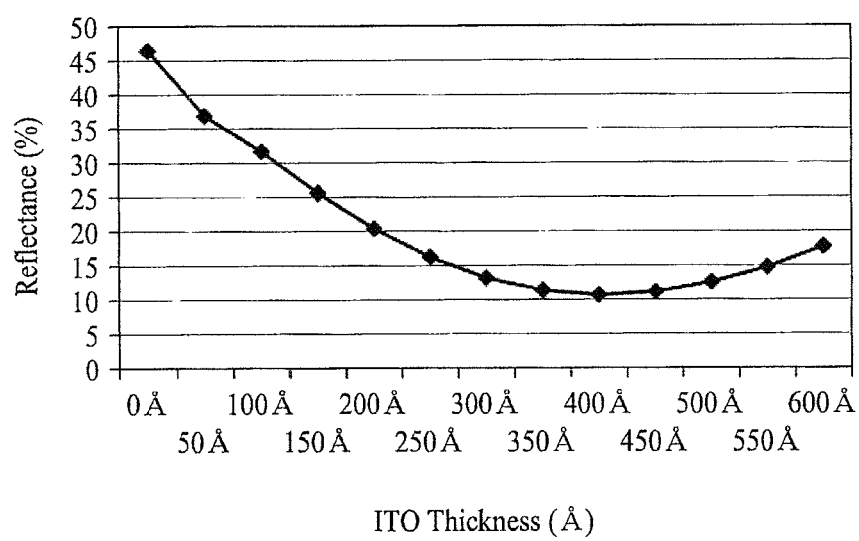
FIG. 6 is a graph illustrating reflectance of a gate electrode, which is based on a thickness of a transparent metal layer shown in FIG. 3.

FIG. 3 is a cross-sectional view illustrating a structure of a gate electrode according to the embodiment of the present invention, and relates to the gate electrode shown in FIG. 2. FIGS. 4 and 5 are exemplary views illustrating destructive interference between a first reflective light and a second reflective light, which are shown in FIG. 3. FIG. 6 is a graph illustrating reflectance of a gate electrode, which is based on a thickness of a transparent metal layer shown in FIG. 3.

Referring to FIGS. 3 to 6, the gate electrode GE according to the embodiment of the present invention includes a semi-transmissive metal layer ML1, a transparent metal layer ML2, and a reflective metal layer ML3.

The semi-transmissive metal layer ML1 is provided on the gate insulating GI film. The semi-transmissive metal layer ML1 may be a metal thin film having excellent adhesion with the gate insulating GI film and transmittance of 40% or more. The semi-transmissive metal layer ML1 may be, but is not limited to, any one of metal materials, for example, Mo, Al, Cr, Au, Ti, Ni, Nd, and Cu. In this case, transmittance of the semi-transmissive metal layer ML1 may be determined in accordance with its thickness. The inventors of the present invention have confirmed through several experiments that Mo deposited with a thickness of 50 Å has transmittance of 40% or more. Therefore, the semi-transmissive metal layer ML1 according to the embodiment of the present invention may be Mo deposited with a thickness of 50 Å.

The transparent metal layer ML2 is provided on the semi-transmissive metal layer ML1. The transparent metal layer ML2 is provided between the semi-transmissive layer ML1 and the reflective metal layer ML3. According to the embodiment of the present invention, a distance D between the semi-transmissive metal layer ML1 and the reflective metal layer ML3 may be controlled, whereby destructive interference may occur between the first reflective light A reflected on a surface of the semi-transmissive metal layer ML1 and the second reflective light B reflected on a surface of the reflective metal layer ML3, and reflectance of the gate electrode GE may be reduced. In this case, the distance D between the semi-transmissive metal layer ML1 and the reflective metal layer ML3 is the same as the thickness of the transparent metal layer ML2. That is, the thickness of the transparent metal layer ML2 may be controlled, whereby destructive interference may occur between the first reflective light A and the second reflective light B, and thus reflectance of the gate electrode GE may be reduced.

The inventors of the present invention have confirmed through several experiments that reflectance of the gate electrode GE is gradually reduced in accordance with increase of the thickness of the transparent metal layer ML2. However, it has been noted that reflectance of the gate electrode GE is again increased if the thickness of the transparent metal layer ML2 exceeds 450 Å. Particularly, reflectance of the gate electrode GE has the lowest value of 10.6% when the thickness of the transparent metal layer ML2 is 400 Å. Therefore, the thickness of the transparent metal layer ML2 according to the present invention may be set to any one of values in the range of 350 Å to 450 Å by considering an error range during deposition. In this case, Mo deposited with a thickness of 50 Å may be used as the semi-transmissive metal layer ML1, and Cu deposited with a thickness of 2000 Å may be used as the reflective metal layer ML3. Also, indium-tin-oxide (ITO) has been used as the transparent metal layer ML2. However, the transparent metal layer ML2 is not limited to ITO, and may be indium-zinc-oxide (IZO), for example.

The reflective metal layer ML3 is provided on the transparent metal layer ML2. Since the reflective metal layer ML3 should reflect both the external light entering the semi-transmissive metal layer ML1 and the external light entering the transparent metal layer ML2, the reflective metal layer ML3 may be, but is not limited to, an opaque metal material, for example, any one of Mo, Al, Cr, Au, Ti, Ni, Nd and Cu.

In short, if the external light enters the gate electrode GE by passing through the base substrate 110, the external light is partially reflected on the surface of the semi-transmissive metal layer ML1. In the present invention, this light is referred to as the first reflective light A. Also, the other external light except the first reflective light A is reflected on the surface of the reflective metal layer ML3 after transmitting the semi-transmissive metal layer ML1 and the transparent metal layer ML2. In the present invention, this light is referred to as the second reflective light B. In this case, as the thickness of the transparent metal layer ML2 is controlled, destructive interference may occur between the first reflective light A and the second reflective light B. The destructive interference means that the amplitude of a complex wavelength becomes small as two wavelengths having phases opposite to each other are overlapped with each other.

According to the embodiment of the present invention, by controlling the thickness of the transparent metal layer ML2, the wavelengths of the first reflective light A and the second reflective light B may be overlapped with each other by opposite phases, whereby the amplitude of the complex wavelength A+B may be reduced. Since the amplitude of the complex wavelength A+B is reduced, the reflective light entering the display panel from the outside and reflected by the gate electrode GE may be reduced. That is, as the thickness of the transparent metal layer ML2 is controlled, destructive interference may occur between the first reflective light A and the second reflective light B, whereby reflectance of the gate electrode GE may be reduced. Therefore, the reflective light reflected by the gate electrode GE and emitted to the outside may be reduced, whereby outdoor visibility of the display panel may be improved.

Although the gate electrode GE has been only described in the present invention, the source electrode SE and the drain electrode DE may have the same structure as that of the gate electrode GE and may provide the same effect as that of the gate electrode GE. That is, if each of the source electrode and the drain electrode is provided equally to the gate electrode, destructive interference occurs between the reflective light at the semi-transmissive metal layer and the reflective light at the reflective metal layer, whereby reflectance of the source electrode and the drain electrode may be reduced. Since reflectance of the source electrode and the drain electrode is reduced, the reflective light emitted to the outside of the display panel may be reduced, whereby outdoor visibility of the display panel may be improved.

Figure 7:
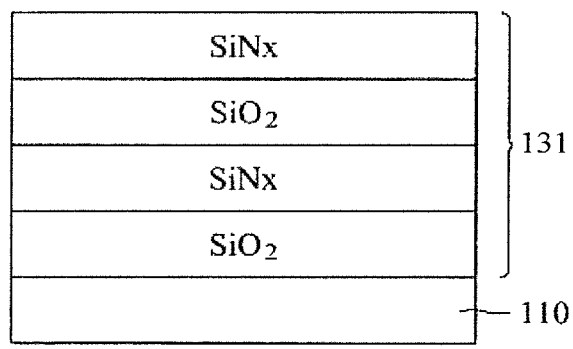
FIG. 7 is a cross-sectional view illustrating a structure of a buffer layer according to the embodiment of the present invention.
Figure 8:
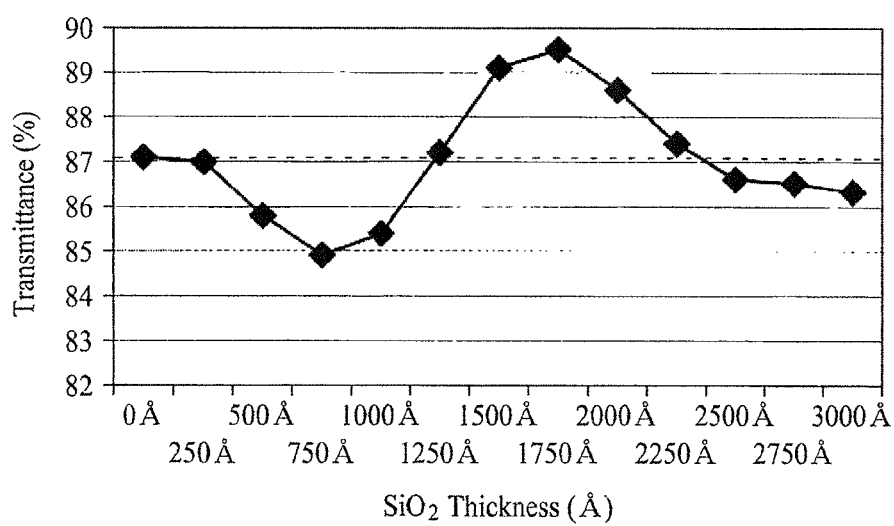
FIG. 8 is an exemplary view illustrating transmittance of a buffer layer, which is based on a thickness of a silicon dioxide film shown in FIG. 7.
Figure 9:
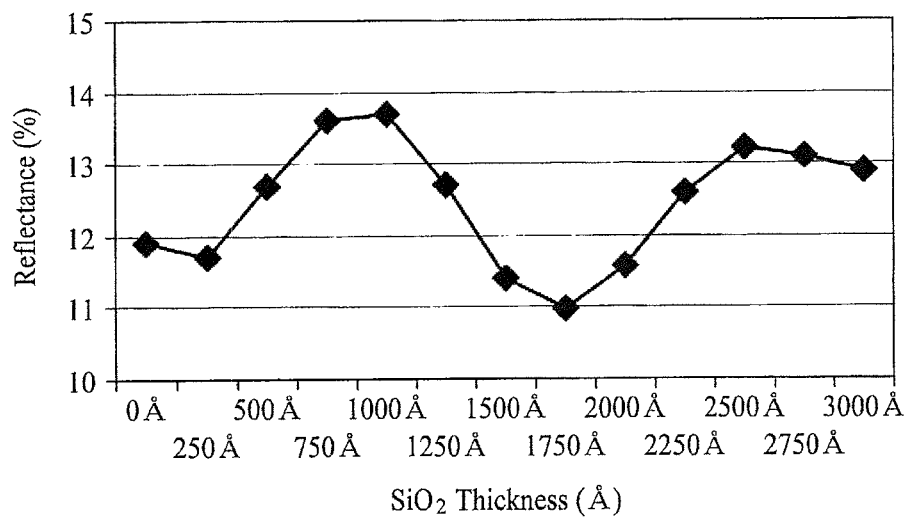
FIG. 9 is a graph illustrating reflectance of a gate electrode, which is based on a thickness of a silicon dioxide film shown in FIG. 7.

FIG. 7 is a cross-sectional view illustrating a structure of a buffer layer according to the embodiment of the present invention, and is intended to illustrate a structure of a first buffer layer of the buffer layer described with reference to FIG. 2. FIG. 8 is an exemplary view illustrating transmittance of a buffer layer, which is based on a thickness of a silicon dioxide film shown in FIG. 7. FIG. 9 is a graph illustrating reflectance of a gate electrode, which is based on a thickness of a silicon dioxide film shown in FIG. 7.

Referring to FIGS. 7 to 9, the first buffer layer 131 of the buffer layer 130 according to the embodiment of the present invention is provided on the base substrate 110. The first buffer layer 131 is comprised of at least two or more inorganic films considering barrier properties. Therefore, the first buffer layer 131 may be comprised of a silicon dioxide ($SiO_2$) film and a silicon nitride (SiNx) film, which are sequentially deposited. Although a plurality of silicon dioxide ($SiO_2$) films and a plurality of silicon nitride (SiNx) films, which are deposited alternately, are shown in the embodiment of the present invention, the present invention is not limited to this deposition structure, and various modifications may be made in the deposition structure of the silicon dioxide ($SiO_2$) film and the silicon nitride (SiNx) film.

The thickness of each of the silicon dioxide ($SiO_2$) film and the silicon nitride (SiNx) film may be set considering reflectance of the electrodes (gate electrode, source electrode and drain electrode) provided on the first buffer layer 131. The inventors of the present invention have confirmed through several experiments that reflectance of each of the electrodes may be reduced to 12% or less if transmittance of the first buffer layer 131 is 88% or more. Referring to FIGS. 8 and 9, when the thickness of the silicon dioxide film ($SiO_2$) is 1500 Å to 2000 Å, the first buffer layer 131 has transmittance of 88% or more and each of the electrodes has transmittance of 12% or less. In this case, the thickness of the silicon dioxide ($SiO_2$) film may be the same as or thicker than that of the silicon nitride (SiNx) film. The thickness of the silicon nitride (SiNx) film according to this experiment has been set to 1500 Å.

If the buffer layer 130 according to the embodiment of the present invention is provided, reflectance of the electrodes provided inside the display panel may be reduced to 12% or less, whereby outdoor visibility of the display panel may be improved.

Figure 10:
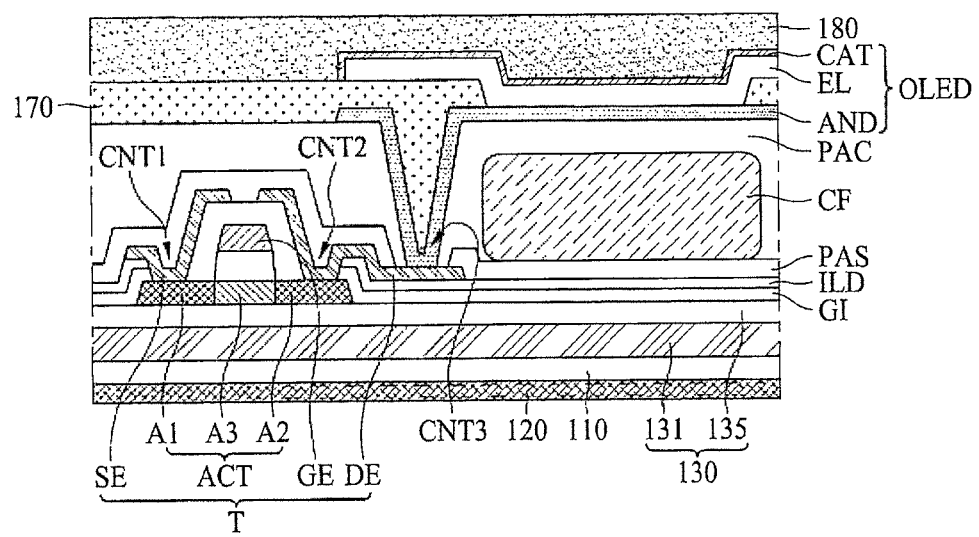
FIG. 10 is a cross-sectional view illustrating an organic light emitting display device according to another embodiment of the present invention.
Figure 11:
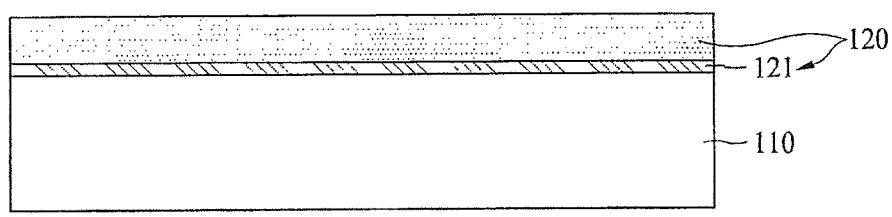
FIG. 11 is an exemplary view illustrating a lower film shown in FIG. 10.
Figure 12:
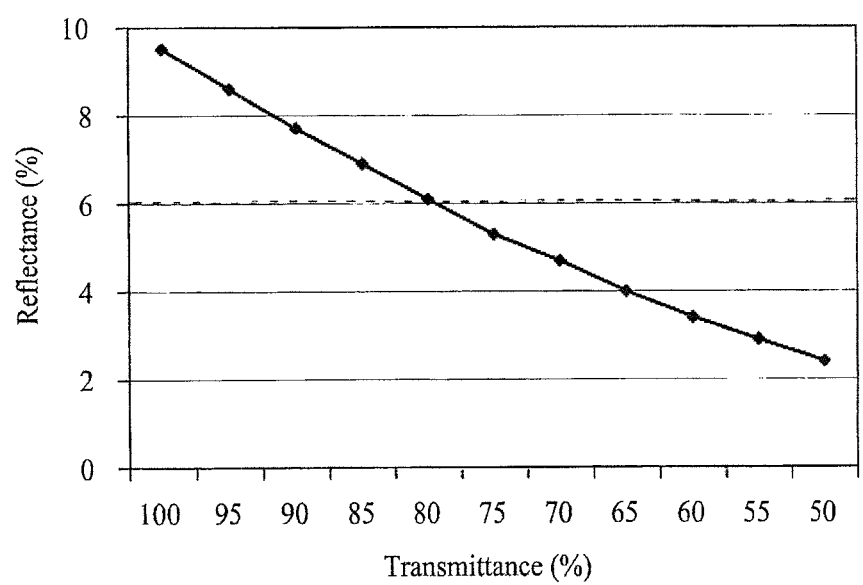
FIG. 12 is a graph illustrating reflectance of a display panel, which is based on transmittance of a lower film shown in FIG. 10.

FIG. 10 is a cross-sectional view illustrating an organic light emitting display device according to another embodiment of the present invention. FIG. 11 is an exemplary view illustrating a lower film shown in FIG. 10. FIG. 12 is a graph illustrating reflectance of a display panel, which is based on transmittance of a lower film shown in FIG. 10. In this case a lower film 120 is additionally provided below the base substrate 110 shown in FIG. 2. Therefore, the lower film 120 and its related elements will be described, and repeated description of the other elements will be omitted.

Referring to FIGS. 10 to 12, the lower film according to another embodiment of the present invention is attached to the lower portion of the base substrate 110. The lower film 120 is attached to an entire surface below the base substrate 110. The lower film 120 controls transmittance of external light entering the organic light emitting display panel 100. The lower film 120 absorbs the reflective light reflected by the electrodes inside the organic light emitting display panel 100. To this end, the lower film 120 may include a light absorption material 121 such as a black pigment.

Transmittance of the lower film 120 according to the present invention may be 80% to 50%. Generally, a limit of reflectance which is not perceived by the naked eye is 6% or less. Reflectance which is not perceived by the naked eye means that outdoor visibility of the organic light emitting display panel 100 is excellent. If the lower film 120 having transmittance of 80% to 50% is used like the present invention, reflectance of the organic light emitting display panel 100 may be lowered to 6% or less. That is, if the lower film 120 is provided below the base substrate 110 of the organic light emitting display panel 100, reflectance of the organic light emitting display panel 100 may additionally be reduced as compared with the case where the lower film 120 is not provided. In this case, outdoor visibility of the display panel may additionally be improved.

According to the embodiments of the present invention, destructive interference may occur between the reflective light at the semi-transmissive metal layer and the reflective light at the reflective metal layer in accordance with the thickness of the transparent metal layer provided between the semi-transmissive metal layer and the reflective metal layer, whereby reflectance of each of the electrodes provided in the thin film transistor may be reduced. Therefore, the reflective light emitted to the outside of the display panel may be reduced, whereby outdoor visibility of the display panel may be improved.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting display device comprising:
    a base substrate;
    a buffer layer arranged on the base substrate;
    a thin film transistor arranged on the buffer layer, the thin film transistor including a gate electrode, a source electrode, and a drain electrode; and
    an organic light emitting diode connected to the thin film transistor and arranged on the thin film transistor,
    wherein at least one of the gate electrode, the source electrode and the drain electrode includes a semi-transmissive metal layer, a transparent metal layer, and a reflective metal layer,
    wherein a thickness of the transparent metal layer is configured such that a first reflective light at the semi-transmissive metal layer and a second reflective light at the reflective metal layer destructively interfere, and
    wherein the buffer layer includes a first buffer layer provided on the base substrate and including a plurality of silicon dioxide films and a plurality of silicon nitride films that are alternately stacked, and a second buffer layer provided on the first buffer layer.

2. The organic light emitting display device of claim 1, wherein the semi-transmissive metal layer is the thinnest, and the reflective metal layer is the thickest, among the semi-transmissive metal layer, the transparent metal layer and the reflective metal layer.

3. The organic light emitting display device of claim 1, wherein the reflective metal layer reflects more light than the semi-transmissive metal layer.

4. The organic light emitting display device of claim 1, wherein the transparent metal layer has the thickness in the range of 350 Å to 450 Å.

5. The organic light emitting display device of claim 1, wherein the base substrate is a polyimide (PI) film having a coefficient of thermal expansion of 10 ppm/° C. or less.

6. The organic light emitting display device of claim 1, further comprising a lower film arranged below the base substrate, wherein the lower film includes a material that absorbs light.

7. The organic light emitting display device of claim 6, wherein the lower film has a transmittance of 80% to 50%.

8. The organic light emitting display device of claim 1, wherein a thickness of the silicon dioxide film is the same as or thicker than that of the silicon nitride film.

9. The organic light emitting display device of claim 8, wherein the thickness of the silicon dioxide film is in the range of 1500 Å to 2000 Å.

10. The organic light emitting display device of claim 1, wherein the organic light emitting diode includes:
an anode electrode connected to the drain electrode of the thin film transistor;
an organic light emitting layer provided on the anode electrode; and
a cathode electrode provided on the organic light emitting layer,
wherein the anode electrode is partitioned by a bank.

11. An organic light emitting display device comprising:
a base substrate; a buffer layer disposed on the base substrate;
a thin film transistor disposed on the buffer layer, the thin film transistor including a gate electrode, a source electrode, and a drain electrode, wherein at least one of the gate electrode, the source electrode and the drain electrode includes a semi-transmissive metal layer, a transparent metal layer, and a reflective metal layer, which are sequentially disposed;
an organic light emitting diode connected to the thin film transistor and disposed on the thin film transistor; and
a lower film provided below the base substrate and including a material that absorbs light to reduce reflectance of the gate, source and drain electrodes,
wherein a thickness of the transparent metal layer is configured such that a first reflective light at the semi-transmissive metal layer and a second reflective light at the reflective metal layer destructively interfere, and
wherein the buffer layer includes a first buffer layer provided on the base substrate and including a plurality of silicon dioxide films and a plurality of silicon nitride films that are alternately stacked, and a second buffer layer provided on the first buffer layer.

12. The organic light emitting display device of claim 11, wherein the semi-transmissive metal layer is the thinnest, and the reflective metal layer is the thickest, among the semi-transmissive metal layer, the transparent metal layer and the reflective metal layer.

13. The organic light emitting display device of claim 11, wherein the reflective metal layer reflects more light than the semi-transmissive metal layer.

14. The organic light emitting display device of claim 11, wherein the transparent metal layer has the thickness in the range of 350 Å to 450 Å.

15. The organic light emitting display device of claim 11, wherein the base substrate is a polyimide (PI) film having a coefficient of thermal expansion of 10 ppm/° C. or less.

16. The organic light emitting display device of claim 11, wherein the lower film has a transmittance of 80% to 50%.

17. The organic light emitting display device of claim 11, wherein a thickness of the silicon dioxide film is the same as or thicker than that of the silicon nitride film, and the thickness of the silicon dioxide film is in the range of 1500 Å to 2000 Å.

18. A method of forming an organic light emitting display device, the method comprising:
providing a base substrate;
forming a buffer layer on the base substrate;
forming a thin film transistor on the buffer layer, the thin film transistor including a gate electrode, a source electrode and a drain electrode; and
forming an organic light emitting diode on the thin film transistor, the organic light emitting diode being connected to the thin film transistor,
wherein at least one of the gate electrode, the source electrode and the drain electrode includes a semi-transmissive metal layer, a transparent metal layer, and a reflective metal layer,
wherein a thickness of the transparent metal layer is configured such that a first reflective light at the semi-transmissive metal layer and a second reflective light at the reflective metal layer destructively interfere, and
wherein the buffer layer includes a first buffer layer provided on the base substrate and including a plurality of silicon dioxide films and a plurality of silicon nitride films that are alternately stacked, and a second buffer layer provided on the first buffer layer.

* * * * *